United States Patent [19]
Matsudo

[11] Patent Number: 6,057,694
[45] Date of Patent: May 2, 2000

[54] TESTING METHOD INCLUDING THE REMOVAL OF INSULATIVE FILMS FOR ELECTRICAL CONTACT AND APPARATUS THEREFOR

[75] Inventor: Masahiko Matsudo, Kofu, Japan

[73] Assignee: Tokyo Electron Limited, Tokyo, Japan

[21] Appl. No.: 08/977,558

[22] Filed: Nov. 25, 1997

[30] Foreign Application Priority Data

Dec. 2, 1996 [JP] Japan ..................................... 8-336380

[51] Int. Cl.[7] ............................. G01R 31/26; H01L 21/66

[52] U.S. Cl. ........................... 324/757; 324/765; 324/609

[58] Field of Search .................................. 324/754, 757, 324/765, 602, 609

[56] References Cited

U.S. PATENT DOCUMENTS 5,739,052 4/1998 Krishnan et al. .......................... 438/17
5,861,634 1/1999 Hsu et al. ................................. 257/48

FOREIGN PATENT DOCUMENTS 6-57451 3/1994 Japan .

*Primary Examiner*—Glenn W. Brown
*Attorney, Agent, or Firm*—Oblon, Spivak, McClelland, Maier & Neustadt, P.C.

[57] ABSTRACT

This invention provides a method and apparatus for vapor-phase processing (e.g., plasma-processing) the object to be tested, thereby removing the insulating oxide films at least at portions on the electrodes with which measurement contactors come into contact, bringing the measurement contactors into contact with the portions on the electrodes from which the films have been removed, and testing the electrical characteristics of the object to be tested.

16 Claims, 5 Drawing Sheets

TESTING METHOD INCLUDING THE REMOVAL OF INSULATIVE FILMS FOR ELECTRICAL CONTACT AND APPARATUS THEREFOR

BACKGROUND OF THE INVENTION

The present invention relates to a method and apparatus for testing the electrical characteristics of an electronic element (object to be tested).

In particular, the present invention relates to a method and apparatus for testing the electrical characteristics of an electronic element having an electrode with which a measurement contactor comes into electric contact and, more specifically, to a method and apparatus for testing the electrical characteristics of integrated circuits formed on a semiconductor wafer (to be merely referred to as a "wafer" hereinafter) and of integrated circuits individually diced off from a wafer.

A case will be described in which the present invention is applied to a method and apparatus for testing an integrated circuit formed on a wafer. The present invention relates to a method and apparatus for testing the electrical characteristics of all the electronic elements (objects to be tested) each having an electrode with which a measurement contactor comes into electrical contact. Accordingly, the present invention is not limited to a method and apparatus applied to a method and apparatus for testing an integrated circuit formed on a semiconductor wafer.

In a semiconductor manufacturing process, various steps, e.g., a step of forming a thin film on a wafer by thermal CVD, plasma CVD, or the like, an etching step of removing any unwanted thin-film portion on the wafer, and the like are performed to form a large number of integrated circuits on the wafer. Thereafter, these integrated circuits are diced into individual IC chips and are packaged. Before this packaging, a testing step of testing the electrical characteristics of the respective integrated circuits on the wafer and screening non-defective/defective integrated circuits is run. Alternatively, the same test step is run for the individual IC chips diced off from the wafer.

For example, a probe device is used for this testing step. The probe device generally has a loader unit and a prober unit adjacent to it. The loader unit is a section that conveys the wafer to the prober unit, and has tweezers for conveying one by one wafers stored in a cassette, and a sub chuck for prealigning the wafers during conveyance with the tweezers. The prober unit is a section that electrically tests the wafers. The prober unit has a main chuck and a probe card. The main chuck places the wafer on it, and moves the wafer in the X, Y, and θ directions to align the wafer. The probe card has measurement contactors (probe needles) that come into electrical contact with the electrode pads (made of, e.g., aluminum) of the respective integrated circuits of the wafer on the main chuck, and exchange an electric signal with a tester. In testing, the loader unit extracts a wafer from the cassette with the tweezers and sends it to the prober unit. During this conveyance, the sub chuck prealigns the wafer. After the prealignment, the wafer is moved to the main chuck of the prober unit with the tweezers again. In the prober unit, the main chuck moves in the X, Y, and θ directions to align the wafer. After the alignment, the main chuck moves upward in the Z direction (vertical direction). The probe needles of the probe card come into electrical contact with the electrode pads of the wafer. An electrical signal is exchanged between the tester and the integrated circuits to run a predetermined test on the electrical characteristics. After the test, the wafer is returned into the cassette following the procedure opposite to that described above. Thereafter, the same operation is repeated to test the electrical characteristics of all the wafers in the cassette.

Concerning the integrated circuit on the wafer, as shown in FIG. 5, FIG. 6 and FIG. 7 as well, a wiring layer or interconnect L made of a conductive metal, e.g., aluminum, is protected by a passivation film I made of a polyimide-based resin or the like, and an electrode pad P formed in part of the wiring layer L is exposed from the passivation film I. The aluminum of the exposed electrode pad is extremely prone to oxidation. The surface of this aluminum forms a hard oxide film O having a large thickness (e.g., several 100 Å) due to heat that acts when the passivation film I is formed. Alternatively, a natural oxide film O having a small thickness (e.g., several 10 Å) is formed on the surface of this aluminum by natural oxidization during wafer conveyance. The oxide film O is an insulator and increases the electrical contact resistance in contact of the probe needle with the electrode. When testing the integrated circuit, if the electrode pad P and the contactor merely come into contact with each other, the resistance of the conduction line between them is increased by the oxide film, making it difficult to perform accurate measurement.

When testing a wafer, the film on the electrode pad must be removed, and thereafter the probe needle must be brought into contact with the electrode pad. For this purpose, if, for example, an oblique probe needle is used as the contactor of the probe card, the main chuck (not shown) on which the wafer is placed is overdriven in the Z direction, as indicated by an arrow Z in FIG. 5. By this operation, the needle point of a probe needle N moves in the direction of an arrow Y to shave the oxide film O of the electrode pad P. Then, the probe needle N is brought into direct contact with the electrode pad P to test the integrated circuit. When a vertical needle N1 is used as the contact of the probe card, as shown in FIG. 6, or when a membrane probe card is used as the probe card and a bump N2 is used as the measurement contactor, as shown in FIG. 7, the main chuck is overdriven in the Z direction, as indicated by an arrow Z in FIG. 6 and FIG. 7, and is moved in the Y direction. By this operation, the needle point of the vertical needle N1 of the probe card or the bump N2 of the membrane card shaves an oxide film O. Thus, the vertical needle N1 or bump N2 is brought into direct contact with the electrode pad P to test the integrated circuit.

As described above, conventionally, when the object to be tested is tested by causing a measurement contactor (e.g., a probe needle) to come into contact with the electrode pad P of the integrated circuit formed on the wafer, the film (e.g., an insulating oxide film) on the electrode pad that increases the electrical contact resistance must be removed. For this purpose, the main chuck on which a wafer W is placed is overdriven, or the main chuck is moved upward and simultaneously vibrated slightly in the horizontal direction to shave the insulating oxide film (aluminum oxide film) on the electrode pad P. This conventional testing includes problems as follows.

While the insulating oxide film (aluminum oxide film) on the electrode pad P with the probe needle N is shaved repeatedly, the probe needle N deforms. The heights of the needle points of the large number of probe needles N accordingly become non-uniform, the positions of the needle points are displaced, and contact of the probe needles N with the electrode pads P becomes unstable. As a result, stable measurement cannot be performed, and the service life of the probe needles N suffers.

The shaving of the insulating oxide film (aluminum oxide) attaches to the needle points of the probe needles to make contact of the probe needle N with the electrode pad P unstable, making it difficult to run stable testing. Also, an additional operation of removing the shaving attaching to the probe needle becomes required.

The complicated operation of overdriving the main chuck and the like requires a complicated, sophisticated control system.

If a probe needle comes into contact with a portion, where the insulating oxide film of the electrode pad P is not shaved yet even with the shaving operation described above, and performs measurement, accurate measurement cannot be expected.

BRIEF SUMMARY OF THE INVENTION

The present invention has been made in order to solve the problems described above, and has as its object to develop a new means for removing a film (e.g., an insulating oxide film), which is formed on the electrode of an object to be tested and which increases the electrical contact resistance, so that the operation of shaving the insulating oxide film (aluminum oxide film) on the electrode pad P with a measurement contactor (e.g., a probe needle N) becomes unnecessary, that deformation of the measurement contactor is avoided, that the shaving will not attach to the measurement contactor, that a complicated, sophisticated control system for shaving the insulating oxide film with the measurement contactor becomes unnecessary, and that the measurement contactor and the electrode pad are reliably brought into electrical contact with each other.

The invention relates to a method of testing electrical characteristics of an object to be tested having electrodes with which measurement contactors come into electric contact and on which films that increase electrical contact resistance with the measurement contactors are formed, and the invention is characterized in that the method comprises the steps of vapor-phase processing the object to be tested, thereby removing the films at least at portions on the electrodes with which the measurement contactors come into contact, causing the measurement contactors to come into contact with the portions on the electrodes from which the films have been removed and testing the electrical characteristics of the object to be tested.

The invention further relates to a method of testing electrical characteristics of objects to be tested having electrodes with which measurement contactors come into electric contact and on which films that increase electrical contact resistance with the measurement contactors are formed, and the invention is characterized in that the method comprises the steps of sequentially conveying the objects to be tested from a storage chamber, that stores the objects to be tested, to a process chamber, plasma-processing the objects to be tested in the process chamber, thereby removing the films at least at portions on the electrodes with which the measurement contactors come into contact, conveying the objects to be tested to a test chamber and bringing, in the test chamber, the measurement contactors into contact with the portions on the electrodes from which the films have been removed, and testing the electrical characteristics of the objects to be tested.

The invention further relates to a method of testing electrical characteristics of integrated circuits formed on a semiconductor wafer and having electrodes with which measurement contactors come into electric contact and on which films that increase electrical resistance in electrical contact with the measurement contactors are formed, and the invention is characterized in that the method comprises the steps of plasma-processing the semiconductor wafer, thereby removing the films at least at portions on the electrodes with which the measurement contactors come into contact, bringing the measurement contactors into contact with the portions on the electrodes from which the films have been removed and testing the electrical characteristics of the integrated circuits.

The inventions further relate to a method of testing electrical characteristics of integrated circuits formed on a semiconductor wafer and having aluminum electrodes with which measurement contactors come into electric contact and on which aluminum oxide films that increase electrical contact resistance with the measurement contactors are formed, and these inventions are characterized in that the method comprise the steps of plasma-processing the semiconductor wafer, thereby removing the aluminum oxide films at least at portions on the electrodes of the integrated circuits with which the measurement contactors come into contact, bringing the measurement contactors into contact with the portions on the electrodes from which the films have been removed and testing the electrical characteristics of the integrated circuits.

The invention is characterized in that the plasma-processing step is a step which uses a reactive gas containing a chlorine-based gas.

The invention further is characterized in that the plasma-processing step uses a reactive gas containing at least one gas selected from the group consisting of boron trichloride and carbon tetrachloride.

The invention further is characterized in that the step concerning the plasma process is controlled by a control agent comprising one or at least two members selected from the group consisting of an RF power for plasma generation, a supply rate of a plasma-generating gas, and a pressure of the plasma-generating gas.

The invention further relates to a method of testing electrical characteristics of IC chips having aluminum electrodes with which measurement contactors come into electric contact and on which aluminum oxide films that increase electrical contact resistance with the measurement contactors are formed, and the invention is characterized in that the method comprises the steps of plasma-processing the IC chips, thereby removing the aluminum oxide films at least at portions on the electrodes of the IC chips with which the measurement contactors come into contact, bringing the measurement contactors into contact with the portions on the electrodes from which the films have been removed and testing the electrical characteristics of the IC chips.

The invention further relates to an apparatus for testing electrical characteristics of objects to be tested having electrodes with which measurement contactors come into electric contact and on which films that increase electrical contact resistance with the measurement contactors are formed, and the invention is characterized in that the apparatus comprises storing means for storing the objects to be tested, means for plasma-processing the objects to be tested, thereby removing the films at least at portions on the electrodes with which the measurement contactors come into contact, testing means for bringing the measurement contactors into contact with the portions on the electrodes from which the films have been removed and testing the electrical characteristics of the objects to be tested, and convey means, arranged between the storing means and the plasma process means, between the plasma process means and the testing means, and the testing means and the storing means, for conveying the objects to be tested.

The invention further relates to an apparatus for testing electrical characteristics of integrated circuits formed on a semiconductor wafer and having electrodes with which measurement contactors come into electric contact and on which films that increase electrical contact resistance with the measurement contactors are formed, and the invention is characterized in that the apparatus comprising storing means for storing the semiconductor wafer, means for plasma-processing the semiconductor wafer, thereby removing the films at least at portions on the electrodes with which the measurement contactors come into contact, testing means for bringing the measurement contactors into contact with the portions on the electrodes from which the films have been removed and testing the electrical characteristics of the integrated circuits, and convey means for conveying the semiconductor wafer between the storing means and the plasma process means, between the plasma process means and the testing means, and the testing means and the storing means.

The inventions are further related to an apparatus for testing electrical characteristics of integrated circuits formed on a semiconductor wafer and having aluminum electrodes with which measurement contactors come into electric contact and on which aluminum oxide films that increase electrical contact resistance with the measurement contactors are formed, and these inventions are characterized in that the apparatus comprising storing means for storing the integrated circuits means for plasma-processing the semiconductor wafer, thereby removing the aluminum oxide films at least at portions on the electrodes with which the measurement contactors come into contact, testing means for bringing the measurement contactors into contact with the portions on the electrodes from which the films have been removed and testing the electrical characteristics of the integrated circuits, and convey means for conveying an object to be tested between the storing means and the plasma process means, between the plasma process means and the testing means, and the testing means and the storing means.

The invention further is characterized in that the plasma process in the means for removing the aluminum oxide films is a process which uses a reactive gas containing a chlorine-based gas.

The invention further is characterized in that the plasma process in the means for removing the aluminum oxide films is a process which uses a reactive gas containing at least one gas selected from the group consisting of boron trichloride and carbon tetrachloride.

The invention further is characterized in that the plasma process in the film removing means is controlled by a control agent comprising one or at least two members selected from the group consisting of an RF power for plasma generation, a supply rate of a plasma-generating gas, and a pressure of the plasma-generating gas.

The inventions further relate to an apparatus for testing electrical characteristics of integrated circuits formed on a semiconductor wafer and having aluminum electrodes with which measurement contactors come into electric contact and on which aluminum oxide films that increase electrical contact resistance with the measurement contactors are formed, and these inventions are characterized in that the apparatus comprising storing means for storing the integrated circuits, a plurality of plasma process chambers each having means for plasma-processing the semiconductor wafer, thereby removing the aluminum oxide films at least at portions on the electrodes with which the measurement contactors come into contact, a plurality of test chambers each having testing means for bringing the measurement contactors into contact with the portions on the electrodes from which the films have been removed and testing the electrical characteristics of the integrated circuits, a plurality of convey chambers each having convey means for conveying the semiconductor wafer between the storing means and the plasma process chambers, between the plasma process chambers and the test chambers, and the test chambers and the storing means, and control means for controlling to perform processes in the plurality of plasma process chambers, test chambers, and convey chambers simultaneously in a parallel manner.

The invention further is characterized in that gates through which the semiconductor wafer passes are formed between the chambers, each of the gates being formed with a gate valve for setting the chambers in a hermetic state.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings are in connection with and constitute part of the specification to indicate preferred embodiments of the present invention. These drawings, together with the general description made above and the detailed description of the preferred embodiments to be made hereinafter, contribute to the description of the present invention.

DETAILED DESCRIPTION OF THE INVENTION

The present invention relates to a method and apparatus for testing the electrical characteristics of an object to be tested having electrodes with which measurement contactors come into electric contact and on which films that increase the electrical contact resistance with the measurement contactors are formed. For the sake of understanding of the present invention, the present invention will be described with reference to FIG. 1, FIG. 2, FIGS. 3 and 4 by way of embodiments in which the testing method and apparatus are applied to an integrated circuit formed on a wafer.

Figure 1:
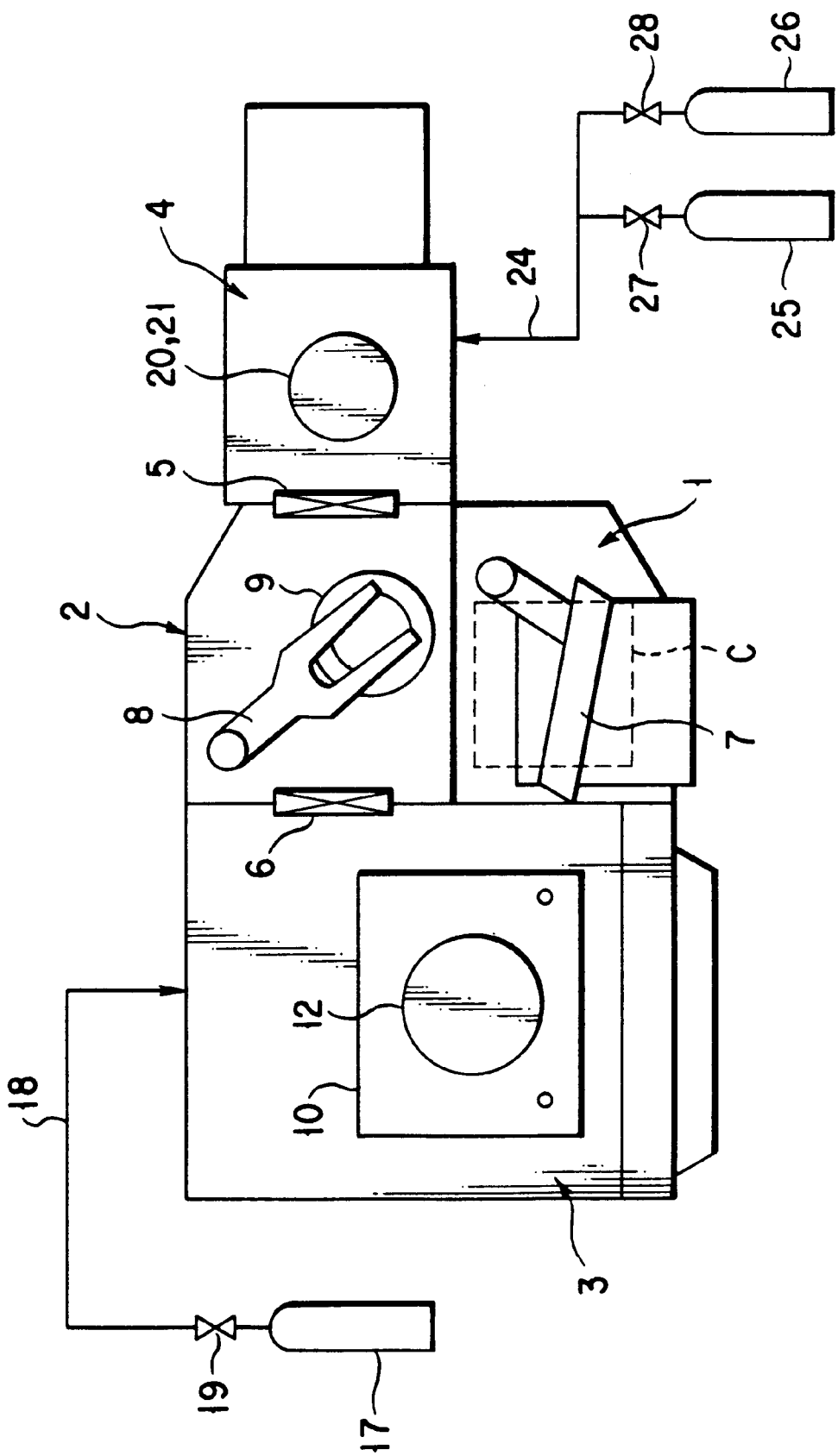
FIG. 1 is a plan view showing the inner portion of a testing apparatus according to an embodiment of the present invention which is suitably used in practicing the testing method of the present invention.

A testing apparatus used in an embodiment of the present invention will be described with reference to FIG. 1 and FIG. 2. This testing apparatus has a wafer storage chamber 1, a convey chamber 2, a test or prober chamber 3, and a plasma process chamber 4. The wafer storage chamber 1 is arranged on the front surface side (lower side in FIG. 1) and stores a cassette C containing, e.g., 25 wafers W. The convey chamber 2 is behind the wafer storage chamber 1 to be adjacent to it and has a convey means (e.g., a wafer arm) for extracting the wafers W from the wafer storage chamber 1 one by one and conveying them. The test chamber 3 and plasma process chamber 4 are arranged on the left and right sides, respectively, of the convey chamber 2. In FIG. 1, reference numeral 7 denotes an operation monitor having a liquid crystal display panel.

A vacuum evacuation device (not shown) is connected to the cassette storage chamber 1, convey chamber 2, and plasma process chamber 4. By this vacuum evacuation device, the interior of the process chamber 4 (plasma process chamber) where vapor phase processing takes place is set to a high vacuum degree (e.g., several 10 to 200 mTorr) suitable for etching aluminum oxide. The cassette storage chamber 1 and the convey chamber 2 also serve as the load-lock chambers of the plasma process chamber 4. Accordingly, the gate between the convey chamber 2 and plasma process chamber 4 can be opened/closed by a gate valve 5, and that between the convey chamber 2 and prober chamber 3 can be opened/closed by a gate valve 6.

The wafers W stored in the cassette C placed on a cassette work table (not shown) in the cassette storage chamber 1 are sequentially conveyed to the plasma process chamber 4 by the convey means of the convey chamber 2. The convey means has an extendable/turnable wafer arm 8. The wafer arm 8 picks up the wafers W from the cassette C one by one and transfers them into the plasma process chamber 4 or test chamber 3 through the gate valve 5 or 6 of which is opened. Before conveying the wafer W to the plasma process chamber 4 or test chamber 3, the wafer arm 8 places it on a sub chuck 9 and prealigns it on the sub chuck 9 by referring to its orientation flat.

The wafer W is subjected to vapor phase processing (e.g., plasma etching) in the plasma process chamber 4, so that any oxide films on the surfaces of the electrode pads of integrated circuits formed on the wafer W are removed. The inner surface of the plasma process chamber 4 is made of, e.g., anodized aluminum. Plane-parallel electrode 21 and electrode 20 are arranged in the plasma process chamber 4. The interior of the plasma process chamber 4 is set to a high vacuum of, e.g., several 10 to 200 mTorr by the vacuum evacuation device (not shown). The plane-parallel electrodes are constituted by the lower electrode 20 serving also as susceptor of the wafer W and the upper electrode 21 serving also as a process gas supply unit. An electrostatic chuck (not shown) is mounted on the upper surface of the lower electrode 20, and chucks the wafer W with the Coulomb's force. The lower electrode 20 is connected to an RF power supply 23 through a blocking capacitor 22. The RF power supply 23 applies an RF power of, e.g., 13.56 MHz, to the lower electrode 20. The upper electrode 21 forms a hollow circular disk, as shown in FIG. 2. A gas pipe 24 for supplying an etching gas is connected to the center of the upper surface of the upper electrode 21, and a large number of holes are formed in the entire lower surface of the upper electrode 21 in a dispersed manner. The gas pipe 24 is connected to a supply source 25 of a reactive gas (e.g., boron trichloride or carbon tetrachloride as a chlorine-based gas) and a supply source 26 of a carrier gas (e.g., argon gas). The reactive gas and carrier gas are supplied into the plasma process chamber 4 at a predetermined ratio and a predetermined flow rate (e.g., 100 to 500 sccm in boron trichloride gas) by adjusting the open degrees of valve 27 and valve 28 of the respective supply sources.

For example, while the interior of the plasma process chamber 4 is maintained at a predetermined high vacuum degree by the vacuum evacuation device and a predetermined RF power is applied to the lower electrode 20, a gas mixture of boron tetrachloride gas and argon gas is supplied to the upper electrode 21 at a predetermined flow rate to cause electric discharge between the lower electrode 20 and upper electrode 21, thereby generating a boron tetrachloride plasma. At this time, a self bias voltage is generated in the lower electrode 20. The reactive ions ($BCl_x$) in the plasma are vertically accelerated toward the lower electrode 20 to bombard the electrode pads of the integrated circuits on the wafer placed on the lower electrode 20. The insulating oxide films (aluminum oxide ($AlO_x$) films; the same applies in the following description) on the surfaces of the electrode pads are removed by reactive etching by the reactive ions. The insulating oxide films are also removed by radical etching by chlorine radicals in the plasma.

The wafer W, the insulating oxide films on the surfaces of the electrode pads of which have been removed, is conveyed to the test chamber 3 by the convey means, and its electrical characteristics are tested. An X-Y table 10 is arranged in the test chamber 3. The X-Y table 10 is moved in the X and Y directions by a motor 11. A main chuck 12 is provided at the center of the X-Y table 10. The main chuck 12 is moved in a Z direction and rotated in a θ direction in the forward and reverse directions by a drive mechanism (not shown). A rotatable test head 13 is mounted on the upper surface of the prober chamber 3. An insert ring 14 is fixed at the center of the test head 13, and a probe card 15 is detachably mounted on the insert ring 14. Furthermore, an alignment mechanism 16 is disposed in the test chamber 3. When the main chuck 12 and the X-Y table 10 are moved in the X, Y, Z, and θ directions, the wafer W on the main chuck 12 is accurately positioned with respect to the measurement contactors (oblique probe needles or vertical needles) of the probe card 15 or measurement contactors (bumps) 15A of a membrane probe card. The alignment mechanism 16 has a first camera 16A, a second camera 16B, and a focus target. The first camera 16A moves horizontally between the main chuck 12 and probe card 15. The second camera 16B is mounted on the non-drive portion of the main chuck 12. The alignment mechanism 16 images the wafer W on the main chuck 12 with the first camera 16A through the focus target, and images the probe needles 15A with the second camera 16B, thereby positioning the wafer W at a predetermined position with respect to the probe needles 15A.

An inert gas supply source 17 for supplying a chemically inert gas (e.g., nitrogen gas) is connected to the test chamber 3 through a pipe 18. By adjusting a valve 19 of the pipe 18, inert nitrogen gas is supplied from the inert gas supply source 17 into the test chamber 3 at a predetermined flow rate. The interior of the prober chamber 3 is set to have a non-oxidizing atmosphere with the nitrogen gas, so that the surfaces of the electrode pads of the wafer W conveyed from the plasma process chamber 4 do not oxidize naturally.

Although not shown, the prober chamber 3 is connected to the vacuum evacuation device. The vacuum evacuation device exhausts the nitrogen gas in the test chamber 3 when evacuating the cassette storage chamber 1, convey chamber 2, and plasma process chamber 4. A stream (e.g., a horizontal stream) of nitrogen gas is always formed in the test chamber 3.

After the test on the electrical characteristics of the wafer W in the test chamber 3 is complete, the wafer W is returned to the cassette C by the convey means, and is finally unloaded from the cassette storage chamber 1.

A testing method according to the present invention will be described together with the operation of the testing apparatus. The vacuum evacuation device is started to make both the wafer cassette storage chamber 1 and convey chamber 2 have a preliminary vacuum atmosphere, and set a high vacuum degree in the vapor phase process chamber (plasma process chamber) 4. A cassette C containing wafers W is stored in the cassette storage chamber 1. The wafer arm 8 extracts one wafer W from the cassette C and mounts it on the sub chuck 9 in the convey chamber 2. The wafer W is prealigned on the sub chuck 9 by referring to its orientation flat.

The gate valve 5 on the plasma process chamber 4 side is opened so that the convey chamber 2 communicates with the plasma process chamber 4. The wafer W on the sub chuck 9 is transferred onto the lower electrode 20 in the plasma process chamber 4 by the wafer arm 8. The wafer arm 8 is retracted from the plasma process chamber 4, and the gate valve 5 is closed, so that the plasma process chamber 4 is disconnected from the convey chamber 2. At this time, the wafer W is electrostaticaly chucked onto the lower electrode 20.

The interior of the plasma process chamber 4 is set to a predetermined vacuum degree by the vacuum evacuation device, and the reactive gas supply source 25 and carrier gas supply source 26 supply the respective gases at a predetermined ratio (e.g., $BCl_3$:Ar=4:1) and a predetermined flow rate (e.g., 500 sccm). When the interior of the plasma process chamber 4 reaches a predetermined atmosphere, an RF power is applied to the lower electrode 20, and a boron trichloride gas plasma is generated by electric discharge between the lower electrode 20 and upper electrode 21. Reactive ions generated from the boron trichloride gas are vertically accelerated toward the lower electrode 20. The insulating oxide films (aluminum oxide films) on the electrode pads of the respective integrated circuits on the wafer W are removed by reactive etching and radial etching. From the surfaces of the electrode pads, the insulating films at least at portions with which the measurement contactors come into contact are removed, and aluminum is exposed.

Figure 2:
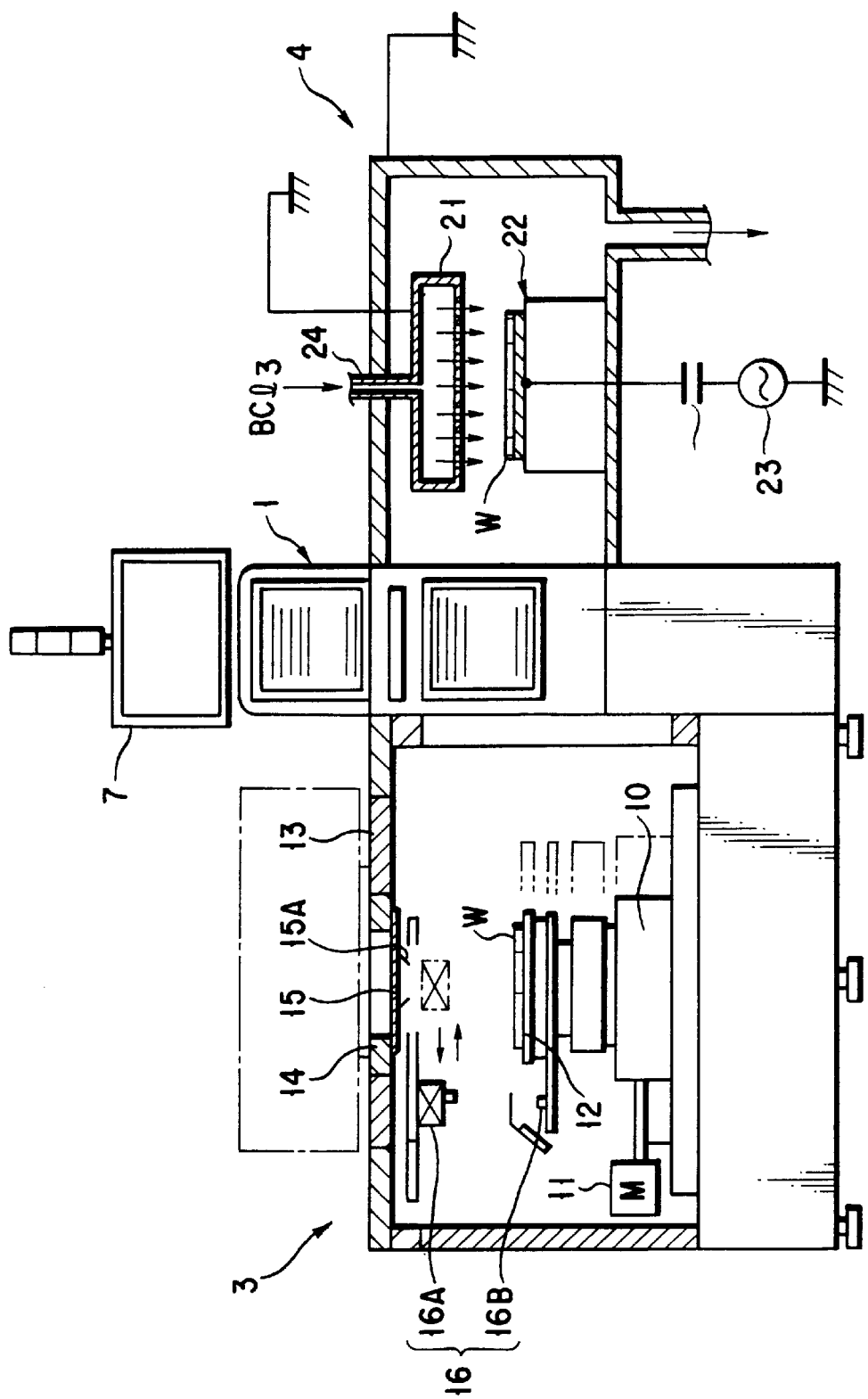
FIG. 2 is a sectional view showing the main part of the testing apparatus shown in FIG. 1.
Figure 3A:
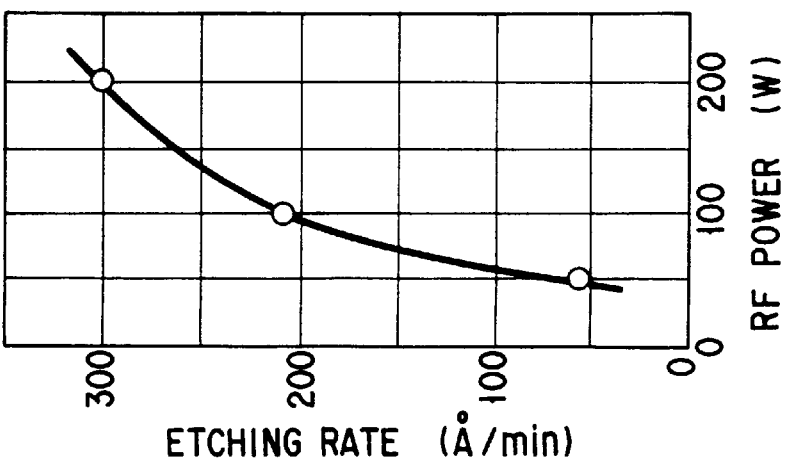
FIG. 3A, FIG. 3B and FIG. 3C are graphs showing the relationship between various conditions and the etching rate when the oxide film is removed by using the testing apparatus shown in FIG. 1 and FIG. 2.
Figure 3B:
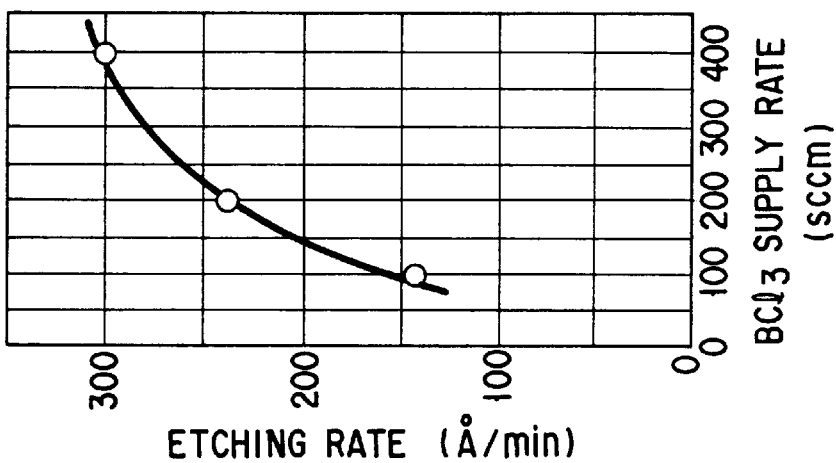
Figure 3C:
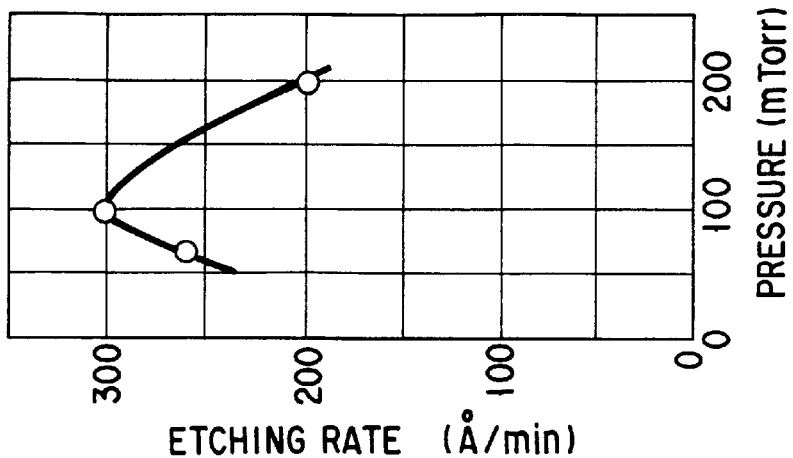

FIG. 3A, FIG. 3B, and FIG. 3C are graphs respectively showing the relationship between the RF power and the etching rate, between the $BCl_3$ supply rate and the etching rate, and between the pressure and the etching rate when the testing apparatus shown in FIG. 1 and FIG. 2 removes the insulating oxide film (aluminum oxide).

The graphs shown in FIG. 3A, FIG. 3B and FIG. 3C show the data on experiments each conducted by using a wafer obtained by forming an aluminum film on the surface of a silicon wafer by vapor deposition. The aluminum oxide film on the wafer was formed by placing the wafer in a high-temperature humidifying device having, e.g., a humidity of 100% and a temperature of 150° C., and leaving it to stand for 1 hour 30 minutes. The presence/absence of an oxide film was determined from a change in sheet resistance. If the sheet resistance showed no change, the presence/absence of an oxide film was determined from a change in weight of the aluminum wafer or from an SEM picture.

Referring to FIG. 3A, FIG. 3B and FIG. 3C, when, e.g., an RF power of 200 W is applied to the lower electrode 20, boron trichloride gas is supplied at a flow rate of 400 sccm, and the interior of the process chamber 4 is maintained at a high vacuum degree of 100 mTorr, the aluminum oxide film is removed 300 Å from the wafer W by etching for 1 minute. If the oxide film is thinner (e.g., a natural oxide film), it can be removed with a lower RF power, a smaller amount of boron trichloride gas, and at a lower vacuum degree.

After the insulating oxide film (aluminum oxide film) on the electrode pad is removed, as described above, supply of the boron trichloride gas is stopped, and the gate valve 5 is opened. The wafer arm 8 removes the wafer W from the plasma process chamber 4, and the gate valve 5 is closed. The wafer arm 8 transfers the wafer W onto the sub chuck 9 in the convey chamber 2. The wafer W is prealigned on the sub chuck 9, and the gate valve 6 is opened, so that the convey chamber 2 communicates with the test chamber 3. At this time, since nitrogen gas has been supplied from the inert gas supply source 17 into the test chamber 3, the interior of the test chamber 3 has already been set in a non-oxidizing nitrogen gas atmosphere. The cassette storage chamber 1 and convey chamber 2 are divided from each other with a gate valve. When the wafer W is transferred from the convey chamber 2 to the test chamber 3, only the convey chamber 2 communicates with the prober chamber 3 while the cassette storage chamber 1 stays evacuated. Therefore, only the convey chamber 2 need be evacuated next. As a result, the load acting on the vacuum evacuation device is decreased.

In the test chamber 3, the X-Y table 10 is driven by the motor 11 in the nitrogen gas atmosphere and waits at a position to receive the wafer W sent from the convey chamber 2. The wafer arm 8 moves the prealigned wafer W from the sub chuck 9 onto the main chuck 12 of the X-Y table 10. At this time, the gate valve 6 has been closed. While a test to be described later is run in the test chamber 3, in the convey chamber 2, a wafer W to be processed next is extracted from the cassette C and is moved into the plasma process chamber 4, as described above, and any insulating oxide films (aluminum oxide films) on the electrode pads are removed by etching.

In the test chamber 3, the alignment mechanism 16 moves the X-Y table 10 and main chuck 12 in the X, Y, and θ directions to align the wafer W on the main chuck 12 with the probe needles 15A of the probe card 15. After this alignment, the main chuck 12 moves upward in the Z direction, so that predetermined electrode pads come into contact with the corresponding probe needles 15A. At this time, since the insulating oxide films (aluminum oxide films) on the electrode films have already ben removed and aluminum having no insulating oxide films is exposed, the operation of shaving the aluminum oxide films, which is performed in the conventional testing method, is not necessary. Conduction among the probe needles 15A, the tester, and the electrode pads can be sufficiently ensured by only moving the main chuck 12 upward in the Z direction to bring the electrode pads and the probe needles 15A into light contact with each other. The electrical characteristics of each integrated circuit can be tested reliably and accurately.

Figure 4:
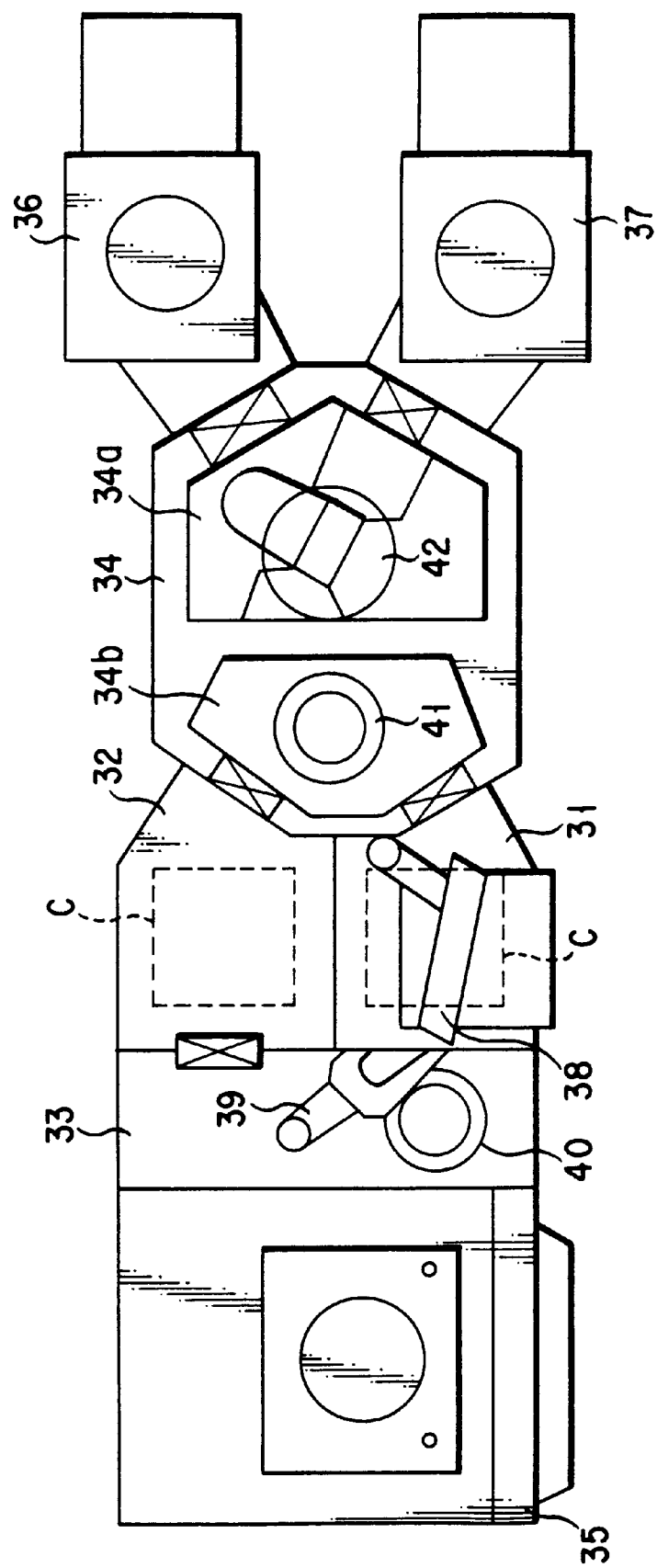
FIG. 4 is a plan view showing the inner portion of a testing apparatus according to another embodiment which is suitably used in practicing the present invention.
Figure 5:
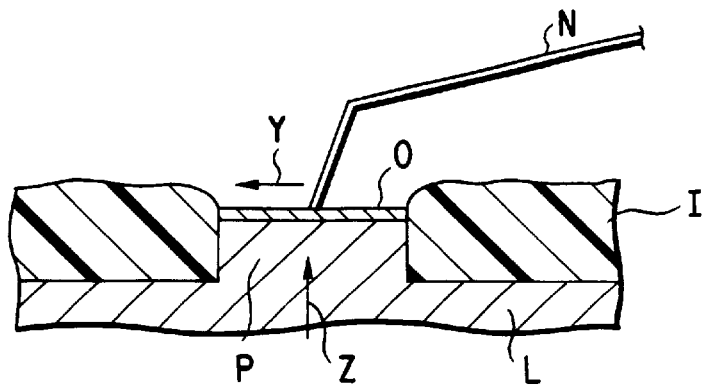
FIG. 5 is a main part enlarged view showing the relationship between the motion of the wafer and the probe needle when testing an IC chip by using a conventional testing apparatus.
Figure 6:
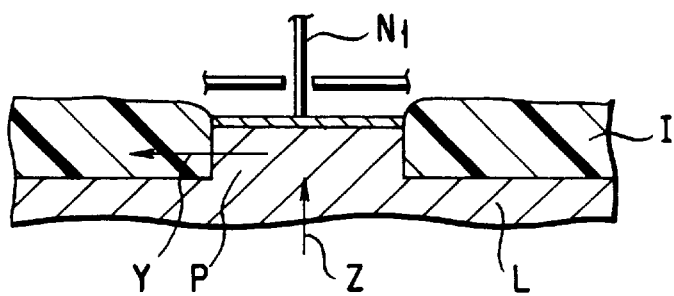
FIG. 6 is a main part enlarged view showing the relationship between the motion of the wafer and the vertical needle when testing an IC chip by using a conventional testing apparatus.
Figure 7:
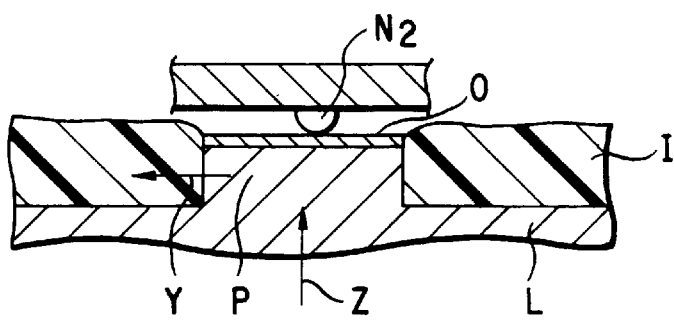
FIG. 7 is a main part enlarged view showing the relationship between the motion of the wafer and the bump when testing an IC chip by using a conventional testing apparatus.

FIG. 4 is a view showing another embodiment of the present invention, in which two vapor phase process chambers (plasma process chambers) are formed. A testing apparatus of this embodiment has first and second wafer storage chamber 31 and chamber 32 arranged in front and behind, first and second convey chamber 33 and chamber 34 arranged on the left and right of the two wafer storage chamber 31 and chamber 32, respectively, a test chamber 35 connected to the convey chamber 33, and first and second plasma process chamber 36 and chamber 37 connected to the convey chamber 34. The test chamber 35 and the plasma process chamber 36 and chamber 37 are constructed in the same manner as in the embodiment shown in FIG. 1 and FIG. 2.

The first wafer storage chamber 31, first convey chamber 33, and test chamber 35 communicate with each other, and an inert gas, e.g., nitrogen gas, is supplied to them during testing to always maintain them in a non-oxidizing atmosphere. The second wafer storage chamber 32 and second convey chamber 34 are formed to serve also as the load-lock chambers of the first and second plasma process chamber 36 and chamber 37, respectively. The second wafer storage chamber 32, first wafer storage chamber 31, and first convey chamber 33 can communicate with or be disconnected from each other through gate valves (not shown). A gate valve is disposed also between the second wafer storage chamber 32 and second convey chamber 34.

A first wafer arm 39 is disposed in the first convey chamber 33. A wafer W after etching is conveyed from the first wafer storage chamber 31 into a cassette C in the second wafer storage chamber 32 through the first wafer arm 39, or from the cassette C in the second wafer storage chamber 32 to the test chamber 35 through the first wafer arm 39. When the first wafer arm 39 conveys the wafer W from the second wafer storage chamber 32 to the prober chamber 35, the wafer W is prealigned on a first sub chuck 40 in the first convey chamber 33.

The second convey chamber 34 can communicate with and be disconnected from the first and second plasma process chamber 36 and chamber 37 through gate valves, and its interior is divided into two chamber 34a and chamber 34b. The two chambers of the second convey chamber 34 can communicate with and be disconnected from each other through a gate valve. A second sub chuck 41 is disposed in the chamber 34b on the second wafer storage chamber 32 side. The wafer W is positioned by the second sub chuck 41. A second wafer arm 42 is disposed in the chamber 34a on the first and second plasma process chamber 36 and chamber 37 side. The wafer W is conveyed between the second wafer storage chamber 32 and the first or second plasma process chamber 36 or 37 through the second wafer arm 42. While the wafer W is conveyed from the cassette C to the first or second plasma process chamber 36 or 37, the second sub chuck 41 positions the wafer W. Referring to FIG. 4, reference numeral 38 denotes an operation monitor having a liquid crystal display panel.

The testing method of the testing apparatus shown in FIG. 4 will be described. The vacuum evacuation device is started to set the second convey chamber 34 in a preliminary vacuum state, and a high vacuum degree in the first and second plasma process chamber 36 and chamber 37. A cassette C storing a plurality of wafers W is stored in the cassette storage chamber 31. The first wafer arm 39 extracts the wafers W from the cassette C in the first wafer storage chamber 31 one by one and transfers the extracted wafer W in the cassette C into the second wafer storage chamber 32. The gate valve between the second wafer storage chamber 32 and first convey chamber 33 is closed, and the second wafer storage chamber 32 is evacuated to the same vacuum degree as that of the second convey chamber 34.

When the interior of the second wafer storage chamber 32 is set in the preliminary vacuum state, the gate valve is opened, and the second wafer storage chamber 32 communicates with the second convey chamber 34. The second wafer arm 42 extracts the wafers W from the second wafer storage chamber 32 one by one, and positions the extracted wafers W on the second sub chuck 41. Each wafer W is transferred onto, e.g., the lower electrode in the first plasma process chamber 36. In the first plasma process chamber 36, the second wafer arm 42 is retracted, and the gate valve is closed. The first plasma process chamber 36 is supplied with boron trichloride gas and argon gas that are supplied from the supply source 25 and supply source 26, respectively, at a predetermined ratio and a predetermined flow rate. The first plasma process chamber 36 is then evacuated, so that its interior is set at a predetermined vacuum degree. An RF power is applied to the lower electrode to cause electric discharge between the lower and upper electrodes and generate a boron trichloride gas plasma. Any insulating oxide films (aluminum oxide films) on the electrode pads of the wafer W are removed by reactive etching and radial etching. During this period of time, a wafer W is transferred from the second wafer storage chamber 32 into the second plasma process chamber 37 and is etched in a similar fashion.

After the insulating oxide films (aluminum oxide films) on the electrode pads are removed in the first plasma process chamber 36, supply of the boron trichloride gas is stopped, and the gate valve is opened. The second wafer arm 42 removes the etched wafer W from the first plasma process chamber 36, the gate valve is closed, and the wafer W is returned to the original position in the cassette C in the second wafer storage chamber 32. The second wafer arm 42 picks up a wafer W to be processed next and transfers it into the first plasma process chamber 36. This wafer W is subjected to plasma processing in the same manner as described above. In this manner, the remaining wafers W are continuously etched by using the first and second plasma process chamber 36 and chamber 37.

In parallel with the process described above, the electrical characteristics of the etched wafer W are tested in the test chamber 35. At this time, the gate valve between the first convey chamber 33 and second wafer storage chamber 32 is opened. In the nitrogen gas atmosphere, the first wafer arm 39 extracts the processed wafer W from the cassette C in the second wafer storage chamber 32, and prealigns it on the first sub chuck 40. This wafer W is transferred onto the main chuck 35A in the test chamber 35. At this time, the gate valve is already closed.

In the test chamber 35, the alignment mechanism aligns the wafer W on the main chuck with the probe needles of the probe card while moving the X-Y table and main chuck in the X, Y, and θ directions. After this alignment, the main chuck moves upward in the Z direction, so that the probe needles come into contact with predetermined electrode pads. At this time, since the aluminum oxide films on the electrode films have already been removed and aluminum having no insulating oxide films is exposed, electrical conduction between the tester and the electrode pads can be ensured by only bringing the electrode pads and the probe needles 15A into light contact with each other, and the electrical characteristics of each integrated circuit can be tested reliably. The operation of shaving the aluminum oxide film, which is performed in the conventional testing method, is not necessary.

As described above with reference to FIG. 1, FIG. 2 and FIG. 4, according to the present invention, prior to testing the electrical characteristics of the wafer W, the wafer W is subjected to vapor phase processing (plasma processing) to reliably remove the insulating oxide films (aluminum oxide films) on its electrode pads. Stable testing can always be run by only bringing the probe needles 15A and the electrode pads into light contact with each other. Since the shaving of the insulating oxide films does not attach to the probe needles 15A, stable conduction can always be maintained, and the electrical characteristics are tested reliably. A complicated, sophisticated control system for overdriving the main chuck or the like becomes unnecessary. Since the insulating oxide films on the electrode pads P can be reliably removed, accurate measurement can be performed.

In the above embodiment, the present invention is applied to cases in which the electrode pads are made of aluminum. However, the electrode pads can be made of any metal other than aluminum.

As the films to be removed from the surfaces of the electrode pads, aluminum oxide films were employed. However, the present invention is not limited to aluminum oxide films but can be applied to any films that "increase electrical contact resistance."

As an example of vapor phase processing for removing "the film which is formed on the surface of the electrode pad and which increases the electrical contact resistance", plasma processing is described. However, as the vapor phase processing, those other than plasma processing can be employed.

As the object to be tested, integrated circuits formed on the semiconductor wafer are described. However, as the object to be tested, the present invention is also applicable to integrated circuits (IC chips) diced off from the wafer.

The present invention is not limited to the integrated circuits but can also be applied to electronic elements in general each having an electrode with which a measurement contactor comes into contact.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A method of testing electrical characteristics of an object to be tested having electrodes with which measurement contactors come into electric contact and on which films that increase electrical contact resistance with said measurement contactors are formed, said method comprising the steps of:

vapor-phase processing the object to be tested, thereby removing the film at least at a portion on each of the electrodes with which said measurement contactors come into contact;

bringing said measurement contactors into contact with the portions on the electrodes from which the films have been removed; and testing the electrical characteristics of the object to be tested.

2. A method of testing electrical characteristics of objects to be tested having electrodes with which measurement contactors come into electric contact and on which films that increase electrical contact resistance with said measurement contactors are formed, said method comprising the steps of:

sequentially conveying the objects to be tested from a storage chamber, that stores the objects to be tested, to a process chamber;

plasma-processing the objects to be tested in said process chamber, thereby removing the film at least at a portion on each of the electrodes with which said measurement contactors come into contact;

conveying the objects to be tested to a test chamber; and bringing, in said test chamber, said measurement contactors into contact with the portions on the electrodes from which the films have been removed, and testing the electrical characteristics of the objects to be tested.

3. A method of testing electrical characteristics of integrated circuits formed on a semiconductor wafer and having electrodes with which measurement contactors come into electric contact and on which films that increase electrical resistance in electrical contact with said measurement contactors are formed, said method comprising the steps of:

plasma-processing the semiconductor wafer, thereby removing the film at least at a portion on each of the electrodes with which said measurement contactors come into contact;

bringing said measurement contactors into contact with the portions on the electrodes from which the films have been removed; and testing the electrical characteristics of the integrated circuits.

4. A method of testing electrical characteristics of integrated circuits formed on a semiconductor wafer and having aluminum electrodes with which measurement contactors come into electric contact and on which aluminum oxide films that increase electrical contact resistance with said measurement contactors are formed, said method comprising the steps of:

plasma-processing the semiconductor wafer, thereby removing the aluminum oxide film at least at a portion on each of the electrodes of the integrated circuits with which said measurement contactors come into contact;

bringing said measurement contactors into contact with the portions on the electrodes from which the films have been removed; and testing the electrical characteristics of the integrated circuits.

5. A method according to claim 4, wherein the plasma-processing step is a step which uses a reactive gas containing a chlorine-based gas.

6. A method according to claim 4, wherein the plasma-processing step uses a reactive gas containing at least one gas selected from the group consisting of boron trichloride and carbon tetrachloride.

7. A method according to claim 4, wherein the step concerning the plasma process is controlled by a control agent comprising one or at least two members selected from the group consisting of an RF power for plasma generation, a supply rate of a plasma-generating gas, and a pressure of the plasma-generating gas.

8. A method of testing electrical characteristics of IC chips having aluminum electrodes with which measurement contactors come into electric contact and on which aluminum oxide films that increase electrical contact resistance with said measurement contactors are formed, said method comprising the steps of:

plasma-processing the IC chips, thereby removing the aluminum oxide film at least at a portion on each of the electrodes of the IC chips with which said measurement contactors come into contact;

bringing said measurement contactors into contact with the portions on the electrodes from which the films have been removed; and testing the electrical characteristics of the IC chips.

9. An apparatus for testing electrical characteristics of objects to be tested having electrodes with which measurement contactors come into electric contact and on which films that increase electrical contact resistance with said measurement contactors are formed, said apparatus comprising:

storing means for storing the objects to be tested;

means for plasma-processing the objects to be tested, thereby removing the film at least at a portion on each of the electrodes with which said measurement contactors come into contact;

testing means for bringing said measurement contactors into contact with the portions on the electrodes from which the films have been removed, and testing the electrical characteristics of the objects to be tested; and convey means for conveying the objects to be tested between said storing means and said plasma processing means, between said plasma processing means and said testing means, and said testing means and said storing means.

10. An apparatus for testing electrical characteristics of integrated circuits formed on a semiconductor wafer and having electrodes with which measurement contactors come into electric contact and on which films that increase electrical contact resistance with said measurement contactors are formed, said apparatus comprising:

storing means for storing the semiconductor wafer;

means for plasma-processing the semiconductor wafer, thereby removing the films at least at portions on the electrodes with which said measurement contactors come into contact;

testing means for bringing said measurement contactors into contact with the portions on the electrodes from which the films have been removed, and testing the electrical characteristics of the integrated circuits; and convey means for conveying the semiconductor wafer between said storing means and said plasma processing means, between said plasma processing means and said testing means, and said testing means and said storing means.

11. An apparatus for testing electrical characteristics of integrated circuits formed on a semiconductor wafer and having aluminum electrodes with which measurement contactors come into electric contact and on which aluminum oxide films that increase electrical contact resistance with said measurement contactors are formed, said apparatus comprising:

storing means for storing the integrated circuits;

means for plasma-processing the semiconductor wafer, thereby removing the aluminum oxide film at least at a portion on the electrodes with which said measurement contactors come into contact;

testing means for bringing said measurement contactors into contact with the portions on the electrodes from which the films have been removed, and testing the electrical characteristics of the integrated circuits; and convey means for conveying an object to be tested between said storing means and said plasma processing means, between said plasma processing means and said testing means, and said testing means and said storing means.

12. An apparatus according to claim 11, wherein the plasma process in said means for removing the aluminum oxide films is a process which uses a reactive gas containing a chlorine-based gas.

13. An apparatus according to claim 11, wherein the plasma process in said means for removing the aluminum oxide films is a process which uses a reactive gas containing at least one gas selected from the group consisting of boron trichloride and carbon tetrachloride.

14. An apparatus according to claim 11, wherein the plasma process in said film removing means is controlled by one or more control agents which are consisted of an RF power for plasma generation, a supply rate of a plasma-generating gas, and a pressure of the plasma-generating gas.

15. An apparatus for testing electrical characteristics of integrated circuits formed on a semiconductor wafer and having aluminum electrodes with which measurement contactors come into electric contact and on which aluminum oxide films that increase electrical contact resistance with said measurement contactors are formed, said apparatus comprising:

storing means for storing the integrated circuits;

a plurality of plasma process chambers each having means for plasma-processing the semiconductor wafer, thereby removing the aluminum oxide films at least at portions on the electrodes with which said measurement contactors come into contact;

a plurality of test chambers each having testing means for bringing said measurement contactors into contact with the portions on the electrodes from which the films have been removed, and testing the electrical characteristics of the integrated circuits;

a plurality of convey chambers arranged between said storing means and said plasma process chambers, between said plasma process chambers and said test chambers, and said test chambers and said storing means and each having convey means for conveying the semiconductor wafer; and control means for controlling to perform processes in said plurality of plasma process chambers, test chambers, and convey chambers simultaneously in a parallel manner.

16. An apparatus according to claim 15, wherein gates through which the semiconductor wafer passes are formed between said chambers, each of said gates being formed with a gate valve for setting said chambers in a hermetic state.

* * * * *